United States Patent
Ku

(10) Patent No.: US 8,520,462 B2
(45) Date of Patent: Aug. 27, 2013

(54) SEMICONDUCTOR MEMORY APPARATUS

(75) Inventor: Kie Bong Ku, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 101 days.

(21) Appl. No.: 13/189,969

(22) Filed: Jul. 25, 2011

(65) Prior Publication Data
US 2012/0218849 A1 Aug. 30, 2012

(30) Foreign Application Priority Data

Feb. 28, 2011 (KR) .................... 10-2011-0018197

(51) Int. Cl.
*G11C 5/14* (2006.01)
(52) U.S. Cl.
USPC .................. 365/226; 365/189.08; 365/227
(58) Field of Classification Search
USPC .............. 365/189.03, 189.08, 191, 200, 201, 365/230.05, 233.1, 233.11, 233.12, 226, 365/227
See application file for complete search history.

(56) References Cited

U.S. PATENT DOCUMENTS

| 6,150,860 A * | 11/2000 | Chun ............................ 327/198 |
| 6,711,075 B2 * | 3/2004 | Saitoh et al. ................. 365/201 |
| 2005/0278592 A1 * | 12/2005 | Yamada et al. ............... 714/721 |
| 2007/0203662 A1 * | 8/2007 | Sugiyama et al. ............. 702/117 |
| 2008/0048703 A1 * | 2/2008 | Yamaguchi ................... 324/763 |

FOREIGN PATENT DOCUMENTS

| KR | 1020010030299 A | 4/2001 |
| KR | 1020010051059 A | 6/2001 |

* cited by examiner

*Primary Examiner* — Alexander Sofocleous
*Assistant Examiner* — Hien Nguyen
(74) *Attorney, Agent, or Firm* — William Park & Associates Patent Ltd.

(57) ABSTRACT

A semiconductor memory apparatus includes a memory cell array including a plurality of chips, a control circuit configured to control an internal operation of the memory cell array, a power circuit configured to supply power to the control circuit, and a mode setting circuit configured to output a flag signal for power supply control based on a mode register set command and data received through a data input/output pad, in response to a clock enable signal.

11 Claims, 3 Drawing Sheets

SEMICONDUCTOR MEMORY APPARATUS

CROSS-REFERENCE TO RELATED APPLICATION

The present application claims priority under 35 U.S.C. §119(a) to Korean Patent Application No. 10-2011-0018197, filed on Feb. 28, 2011, in the Korean Intellectual Property Office, which is incorporated herein by reference in its entirety as if set forth in full.

BACKGROUND

1. Technical Field

Various embodiments of the present invention relate to semiconductor integrated circuits. In particular, certain embodiments relate to a semiconductor memory apparatus.

2. Related Art

In order to maximize its capacity, multiple chips are provided in one module of a semiconductor memory apparatus.

FIG. 1 is a configuration diagram of a typical semiconductor memory apparatus.

As illustrated in FIG. 1, the semiconductor memory apparatus includes a controller 12 and a memory area 14. The memory area 14 may include a plurality of chips packaged therein. The memory area 14 may further include one or more redundancy chips to cope with an occurrence of a failure in a specific chip so as to substitute for the failed chip.

The controller 12 provides the memory area 14 with a clock enable signal CKE, a clock signal CLK, a command CMD, and an address ADD, and transmits/receives data through DQ pins.

For example, when a failure has occurred in a chip 1, the controller 12 may substantially prevent access to the chip 1, and may permit access to one of the redundancy chips when access to the chip 1 is necessary.

However, although the chip 1 is not necessary in further operations because the access path has been changed to the redundancy chip, the controller 12 continuously supplies power to the failed chip as well as chips which are in normal operations. That is, since power is unnecessarily supplied thereto, the total power consumption of the semiconductor memory apparatus increases.

The memory area of the semiconductor memory apparatus may be configured as illustrated in FIG. 2.

FIG. 2 is a diagram explaining a memory area including a plurality of ranks.

A memory area 16 illustrated in FIG. 2 includes a plurality of ranks, and each rank includes a plurality of chips packaged therein. Since each rank also includes one or more redundancy chips, it is possible to repair a failed chip using the redundancy chips.

A memory apparatus including such a memory area 16 may perform an interleaving operation with respect to the plurality of ranks, thereby achieving a high speed operation.

In such a memory apparatus, one rank may be selected by a chip select signal CS, and a chip to be accessed may be selected based on a chip address signal. At this time, power is continuously supplied to unselected chips from a controller, resulting in an increase in the power consumption of the semiconductor memory apparatus.

SUMMARY

Accordingly, there is a need for an improved semiconductor memory apparatus that can efficiently reduce the power consumption.

To attain the advantages and in accordance with the purposes of the invention, as embodied and broadly described herein, one exemplary aspect of the present invention may provide a semiconductor memory apparatus comprising: a memory cell array including a plurality of chips; a control circuit configured to control an internal operation of the memory cell array; a power circuit configured to supply power to the control circuit; and a mode setting is circuit configured to output a flag signal for power supply control based on a mode register set command and data received through a data input/output pad, in response to a clock enable signal.

In another exemplary aspect of the present invention, a semiconductor memory apparatus may comprise: a memory cell array including a plurality of chips; a control circuit configured to control an internal operation of the memory cell array; a power circuit configured to supply power to the control circuit; and a mode setting circuit configured to output a first flag signal based on a mode register set command and information on a failed chip received through a data input/output pad, and output a second flag signal based on the mode register set command and information on an operation mode in units of bytes received through the data input/output pad, in response to a clock enable signal.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION

Figure 1:
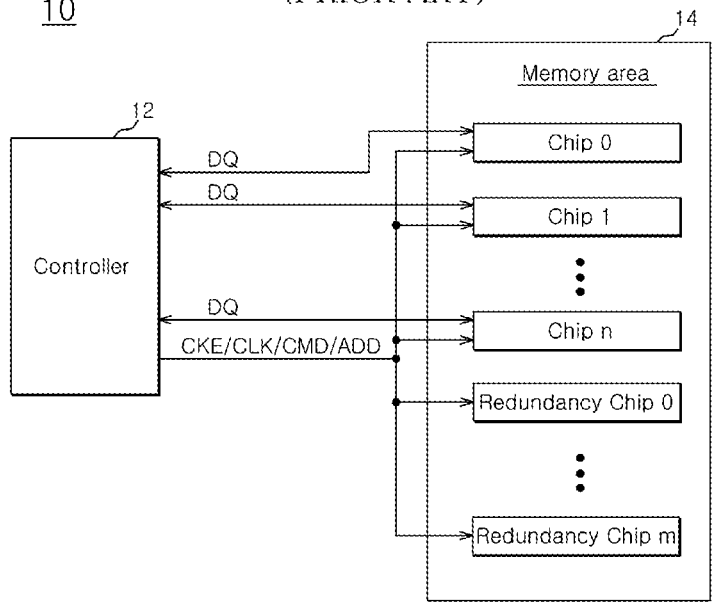
FIG. 1 is a configuration diagram of a general semiconductor memory apparatus.

Reference will now be made in detail to the exemplary embodiments consistent with the present disclosure, examples of which are illustrated in the accompanying drawings. Wherever possible, the same reference characters will be used throughout the drawings to refer to the same or like parts.

Figure 3:
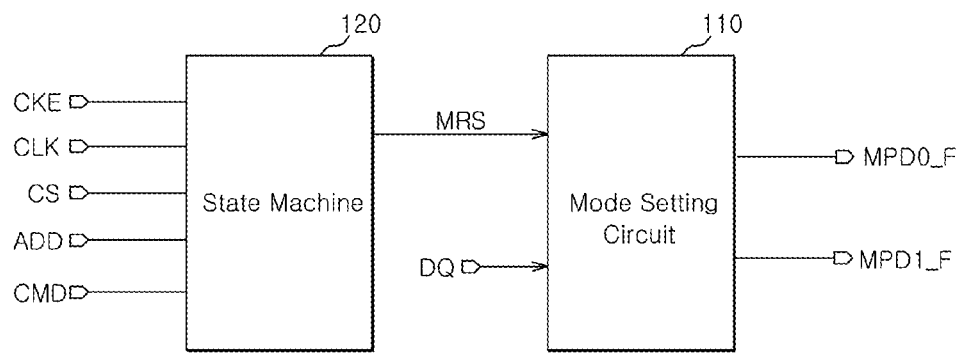
FIG. 3 is a diagram explaining a mode setting circuit according to an exemplary embodiment of the invention.

FIG. 3 is a diagram explaining a mode setting circuit is according to an exemplary embodiment of the invention.

A mode setting circuit 110 according to the embodiment is configured to output a first flag signal MPD0_F and a second flag signal MPD1_F in response to a clock enable signal CKE, a mode register set (MRS) command, and a DQ signal.

The MRS signal may be supplied from a state machine 120. The state machine 120 is configured to determine the states of the memory apparatus in response to the clock enable signal CKE, a clock signal CLK, a chip select signal CS, an address signal ADD, and a command CMD. Specifically, the state machine 120 may be configured to generate an active command for activating the word lines of a memory cell, a read/write command for inputting/outputting data of the memory cell, and the like based on the logic levels of the received chip select signal CS and command CMD (for example, a RAS, a CAS, a WE and the like). Furthermore, the state machine 120 is configured to decode the address signal ADD and the command CMD and output a MRS command.

The mode setting circuit 110 is configured to receive the MRS command, the clock enable signal CKE, and the DQ signal from the state machine 120. According to the exemplary embodiment, the DQ signal may include information on a failed chip or information an operation mode in units of bytes.

When the MRS command is input from the state machine 120 and the information on the failed chip is input as the DQ signal, the mode setting circuit 110 outputs the first flag signal MPD0_F for is allowing all powers for the failed chip to be turned off. Furthermore, the first flag signal MPD0_F is provided to a peripheral circuit, a core circuit, and a power source circuit of the failed chip to allow internal power necessary for the operation of the failed chip to be turned off. In this regard, a mode in which power for the failed chip is turned off may be called a max power-down mode.

In addition, when the MRS command is input from the state machine 120 and the information on the operation mode in units of bytes is input as the DQ signal, the mode setting circuit 110 outputs the second flag signal MPD1_F for disabling the internal operation of the memory area. The second flag signal MPD1_F is provided to a peripheral circuit and a core circuit of the memory area to allow an internal power to be turned off. In such a case, the second flag signal MPD1_F may not be provided to a power circuit. Consequently, when a semiconductor memory apparatus escapes from an operation mode in units of bytes, it is possible to stabilize power at a high speed since the power is supplied only to the peripheral circuit or the core circuit.

The mode setting circuit 110 may be configured as illustrated in FIG. 3. However, the invention is not limited thereto. For example, the state machine 120 may be configured to internally output the first and second flag signals MPD0_F and MPD1_F. In addition, a mode register set decoder may be configured to generate the first and second flag signals MPD0_F and MPD1_F.

Figure 4:
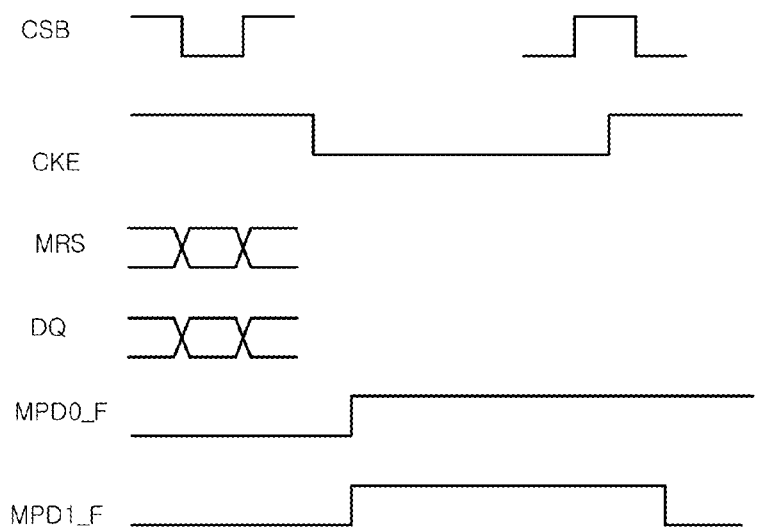
FIG. 4 is a timing diagram explaining a mode setting process according to an exemplary embodiment of the invention.

FIG. 4 is a timing diagram explaining a mode setting is process according to the exemplary embodiment.

When the chip select signal CSB is activated to a low level and the clock enable signal CKE is activated to a high level, the state machine 120 decodes the address signal ADD and the command CMD to generate the MRS command.

When the information on the failed chip is input through a DQ pad, the mode setting circuit 110 logically combines the MRS command with the DQ signal and activates the first flag signal MPD0_F in synchronization with the deactivation timing of the clock enable signal CKE. Then, although the clock enable signal CKE is activated again, the mode setting circuit 110 allows the first flag signal MPD0_F to be substantially maintained in an activation state, thereby substantially preventing power from being supplied to the failed chip.

Meanwhile, when the information on the operation mode in units of bytes is input through the DQ pad, the mode setting circuit 110 logically combines the MRS command with the DQ signal and activates the second flag signal MPD1_F in synchronization with the deactivation timing of the clock enable signal CKE. Then, when a valid command such as a write command or a read command is input and the clock enable signal CKE is activated, the mode setting circuit 110 deactivates the second flag signal MPD1_F.

The time required for substantially preventing all powers from being supplied to a control circuit and a power circuit with respect to a memory chip and for power stabilization when power is is applied again is several hundreds of μs at minimum. However, when only power for the control circuit is blocked and the supply of power to the power circuit is substantially maintained in the operation mode in units of bytes as described in the invention, since only several μs may be spent for power stabilization, the high speed operation of the memory apparatus is possible.

Figure 5:
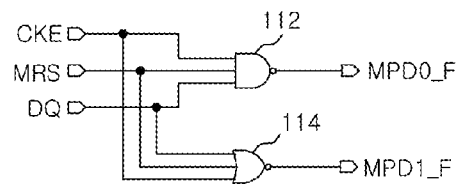
FIG. 5 is a diagram illustrating an example of the mode setting circuit illustrated in FIG. 3.

FIG. 5 is a diagram illustrating an example of the mode setting circuit illustrated in FIG. 3.

As illustrated in FIG. 5, the mode setting circuit 110 includes a first comparison unit 112 and a second comparison unit 114.

The first comparison unit 112 is configured to output the first flag signal MPD0_F in response to the clock enable signal CKE, the MRS command, and the DQ signal. Specifically, the first comparison unit 112 may include a NAND gate which combines the MRS command with the DQ signal to activate the first flag signal MPD0_F as the clock enable signal CKE is activated, and allows the first flag signal MPD0_F to be substantially maintained in an activation state even if the clock enable signal CKE is activated in a high state from a low state, as illustrated in the timing diagram of FIG. 4.

The second comparison unit 114 is configured to output the second flag signal MPD1_F in response to the clock enable signal CKE, the MRS command, and the DQ signal. The second comparison unit 114 may include a NOR gate which combines the MRS command with the DQ signal to activate the second flag signal MPD1_F as the clock is enable signal CKE is activated, and deactivate the second flag signal MPD1_F when the clock enable signal CKE is activated in a high state from a low state, as illustrated in the timing diagram of FIG. 4.

Figure 6:
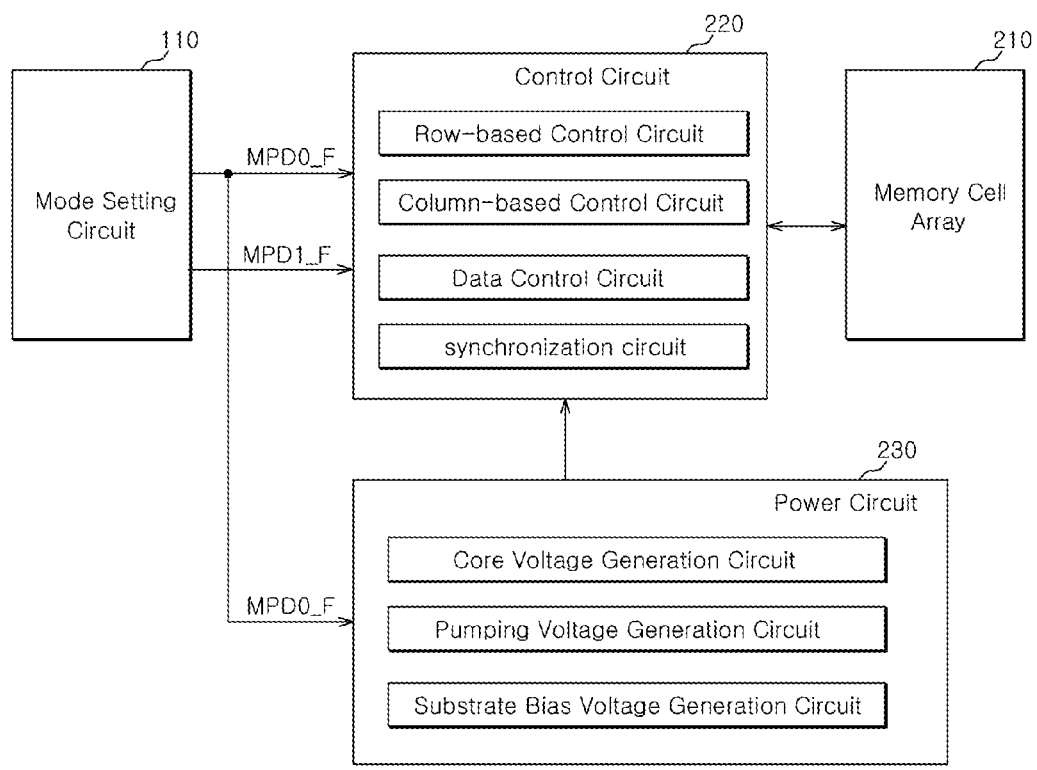
FIG. 6 is a configuration diagram of a semiconductor memory apparatus according to an exemplary embodiment of the invention.

FIG. 6 is a configuration diagram of a semiconductor memory apparatus according to the embodiment.

A semiconductor memory apparatus 200 according to the embodiment includes a memory cell array 210, a control circuit 220 for controlling the internal operation of the memory cell array 210, a power circuit 230 for supplying power necessary for the operation of the control circuit 220, and the mode setting circuit 110 for determining whether to supply power to the control circuit 220 and the power circuit 230.

Figure 2:
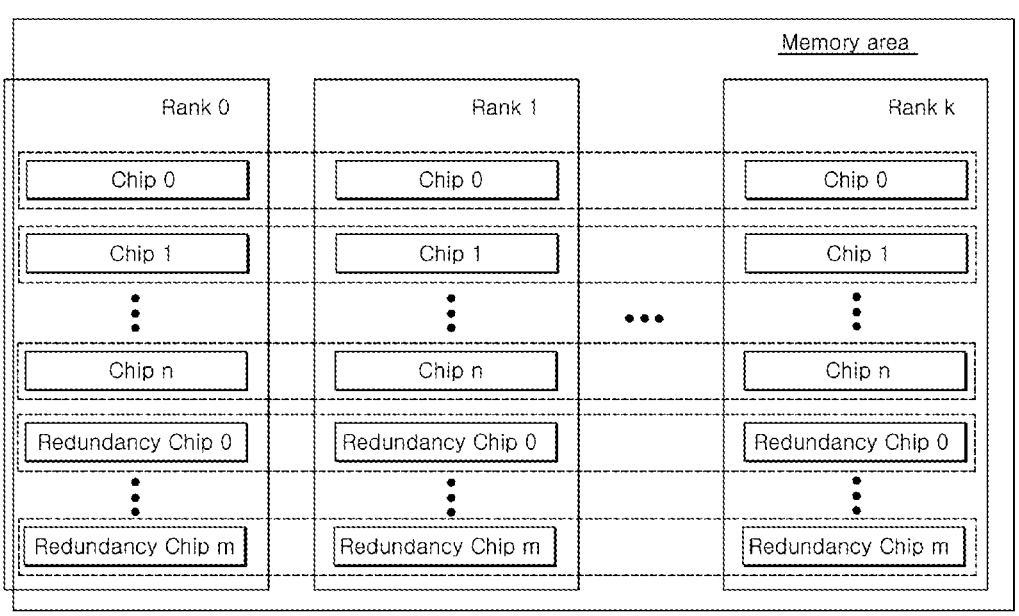
FIG. 2 is a diagram explaining a memory area including a plurality of ranks.

The memory cell array 210 may include a plurality of chips and a plurality of ranks as illustrated in FIGS. 1 and 2.

The control circuit 220 includes a row-based control circuit, a column-based control circuit, a data control circuit, and a synchronization circuit, controls an operation such as active, precharge or refresh, and controls write and read operations while providing an internal clock signal synchronized with an external clock for such operations.

The power circuit 230 includes a core voltage generation circuit, a pumping voltage generation circuit, and a substrate bias voltage generation circuit, and provides the control circuit 220 with an appropriate voltage based on the operation modes of the memory cell array 210.

The mode setting circuit 110 may be configured as illustrated in FIGS. 3 and 5. When a failed chip of the plurality of chips constituting the memory cell array 210 is replaced with a redundancy chip, the mode setting circuit 110 receives information on the failed chip as the DQ signal, and generates the first flag signal MPD0_F in response to the clock enable signal CKE and the MRS command. The first flag signal MPD0_F is provided to the control circuit 220 and the power circuit 230 to substantially prevent power from being supplied to the control circuit 220 and the power circuit 230 which are associated with the operation of the failed chip not being used.

Meanwhile, when the memory cell array 210 is used in the operation mode in units of bytes, the mode setting circuit 110 receives information on the operation mode in units of bytes as the DQ signal, and generates the second flag signal MPD1_F in response to the clock enable signal CKE and the MRS command. The second flag signal MPD1_F may be provided to the control circuit 220. In such a case, the supply of power to the power circuit 230 is substantially maintained and only the supply of power to the control circuit 220 is blocked. Consequently, when the memory cell array 210 escapes from the operation mode in units of bytes, since only the supply of power to the control circuit 220 is performed, it is possible to reduce the time required for power stabilization.

As a consequence, in the semiconductor memory apparatus according to the embodiment, the supply of all powers to a failed chip is blocked, so that it is possible to minimize power consumption. In addition, it is possible to selectively supply power to a control circuit based on the operation modes of the semiconductor memory apparatus. Consequently, it is possible to substantially prevent power from being supplied to an unnecessary circuit and stabilize power at a high speed, resulting in the improvement of an operation speed of the semiconductor memory apparatus.

While certain embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising:
a memory cell array including a plurality of chips;
a control circuit configured to control an internal operation of the memory cell array;
a power circuit configured to supply power to the control circuit; and
a mode setting circuit configured to output a flag signal for power supply control based on a mode register set command and data received through a data input/output pad, in response to a clock enable signal,
wherein the control circuit and the power circuit are configured to be turned on or turned off by selectively provided power according to the flag signal.

2. The semiconductor memory apparatus according to claim 1, wherein the mode setting circuit is configured to receive information on a failed chip through the input/output pad and output a first flag signal.

3. The semiconductor memory apparatus according to claim 2, wherein the first flag signal is activated in synchronization with a deactivation timing of the clock enable signal in response to the mode register set command and the information on the failed chip as the clock enable signal is activated, and an activation state of the first flag signal is substantially maintained regardless of a level of the clock enable signal.

4. The semiconductor memory apparatus according to claim 1, wherein the mode setting circuit is configured to receive information on an operation mode in units of bytes through the input/output pad and output a second flag signal.

5. The semiconductor memory apparatus according to claim 4, wherein the second flag signal is provided to the control circuit.

6. The semiconductor memory apparatus according to claim 4, wherein the second flag signal is activated in synchronization with a deactivation timing of the clock enable signal in response to the mode register set command and the information on the operation mode in units of bytes as the clock enable signal is activated, and the first flag signal is deactivated as the clock enable signal is activated.

7. A semiconductor memory apparatus comprising:
a memory cell array including a plurality of chips;
a control circuit configured to control an internal operation of the memory cell array;
a power circuit configured to supply power to the control circuit; and
a mode setting circuit configured to output a first flag signal based on a mode register set command and information on a failed chip received through a data input/output pad, and output a second flag signal based on the mode register set command and information on an operation mode in units of bytes received through the data input/output pad, in response to a clock enable signal.

8. The semiconductor memory apparatus according to claim 7, wherein the first flag signal is provided to the control circuit and the power circuit.

9. The semiconductor memory apparatus according to claim 7, wherein the first flag signal is activated in synchronization with a deactivation timing of the clock enable signal in response to the mode register set command and the information on the failed chip as the clock enable signal is activated, and an activation state of the first flag signal is substantially maintained regardless of a level of the clock enable signal.

10. The semiconductor memory apparatus according to claim 7, wherein the second flag signal is provided to the control circuit.

11. The semiconductor memory apparatus according to claim 7, wherein the second flag signal is activated in synchronization with a deactivation timing of the clock enable signal in response to the mode register set command and the information on the operation mode in units of bytes as the clock enable signal is activated, and the first flag signal is deactivated as the clock enable signal is activated.

* * * * *